United States Patent [19]
Kawabata et al.

[11] Patent Number: 5,812,433
[45] Date of Patent: Sep. 22, 1998

[54] ELECTROMAGNETIC DRIVING SYSTEM FOR CONTROLLING ELECTROMAGNETIC DRIVING DEVICE BY SIMULATOR

[75] Inventors: Kaoru Kawabata, Hitachi; Motoya Ito, Hitachinaka; Fumio Tajima, Jyuou-machi; Naganori Motoi, Tokai-mura; Hideo Tatumi, Mito, all of Japan

[73] Assignee: Hitachi, Ltd., Tokyo, Japan

[21] Appl. No.: 493,664

[22] Filed: Jun. 22, 1995

[30]     Foreign Application Priority Data

Jul. 1, 1994  [JP]  Japan ................................... 6-151126

[51] Int. Cl.[6] ............................ G06F 9/455; F02D 41/26
[52] U.S. Cl. .................................... 364/578; 364/431.051
[58] Field of Search ....................... 364/424.03, 431.051, 364/578

[56]            References Cited

U.S. PATENT DOCUMENTS

| | | | |
|---|---|---|---|
| 3,760,173 | 9/1973 | Boita ........................................ | 235/184 |
| 3,841,712 | 10/1974 | Syria ..................................... | 303/21 AF |
| 4,831,868 | 5/1989 | Makino .................................. | 73/118.1 |
| 5,012,422 | 4/1991 | Takahashi et al. .................. | 364/431.05 |
| 5,249,151 | 9/1993 | Chang et al. ........................... | 364/578 |
| 5,492,101 | 2/1996 | Saito et al. ............................. | 123/491 |
| 5,557,523 | 9/1996 | Yeh et al. ........................... | 364/424.03 |

FOREIGN PATENT DOCUMENTS

| | | | |
|---|---|---|---|
| 4-175972 | 6/1992 | Japan .............................. | G06F 15/60 |
| 4-218784 | 8/1992 | Japan .............................. | G01R 31/28 |

OTHER PUBLICATIONS

Vekara, Timo T. et al, "Dynamic Model of an Electromagnetic Massive Core Brake Actuator," IEEE Transactions on Magnetics, vol. 32., No. 3, May 1996, pp. 1970–1974.

Pawlak, Andrzej M. et al, "Rotary Actuators," Industry Applications, 1994 Conference, 1994, pp. 361–367.

Wang, Song–Min et al. "Electromagnetic Field Analysis and Dynamic Simulation of a Two–valve Solenoid Actuator," IEEE Transactions on Magnetics, vol. 29, No. 2., Mar. 1993, pp. 1741–1746.

Koji Fujiwara: *Finite Element Analysis of Magnetic Fields in Capacitor–Discharge Impulse Magnetizer*, Mitsui Engineering and Shipbuilding Co. Ltd., pp. 95–104, 8 Nov. 1985.

*Primary Examiner*—Kevin J. Teska
*Assistant Examiner*—N. L. Dehlitsch-Moats
*Attorney, Agent, or Firm*—Kenyon & Kenyon

[57]            ABSTRACT

An electromagnetic driving system controls an electromagnetic driving device by a simulator. The driving system includes a simulation system. The simulation system includes a preprocessor for generating initial data used in the simulation, an analyzer for executing coupling analysis for magnetic field analysis, circuit analysis and control mode analysis, a postprocessor for displaying the output data of the system on a display, and a library for storing data given to and provided by the system. The simulation system is combined with the electromagnetic driving device to control the electromagnetic driving device.

15 Claims, 6 Drawing Sheets

FIG. 2
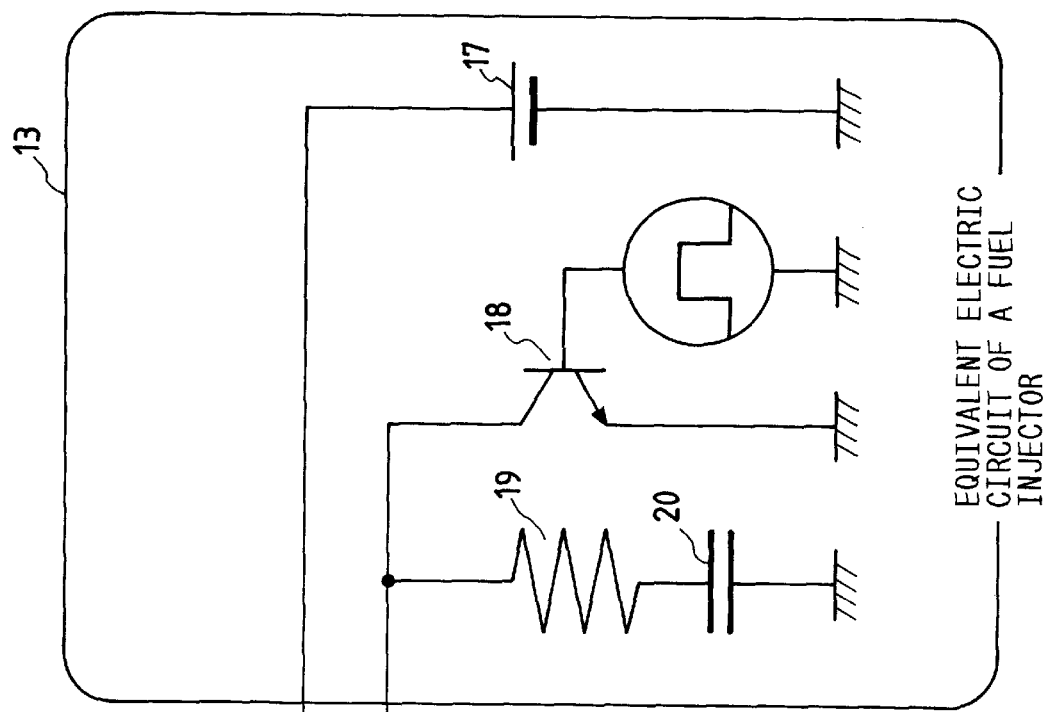
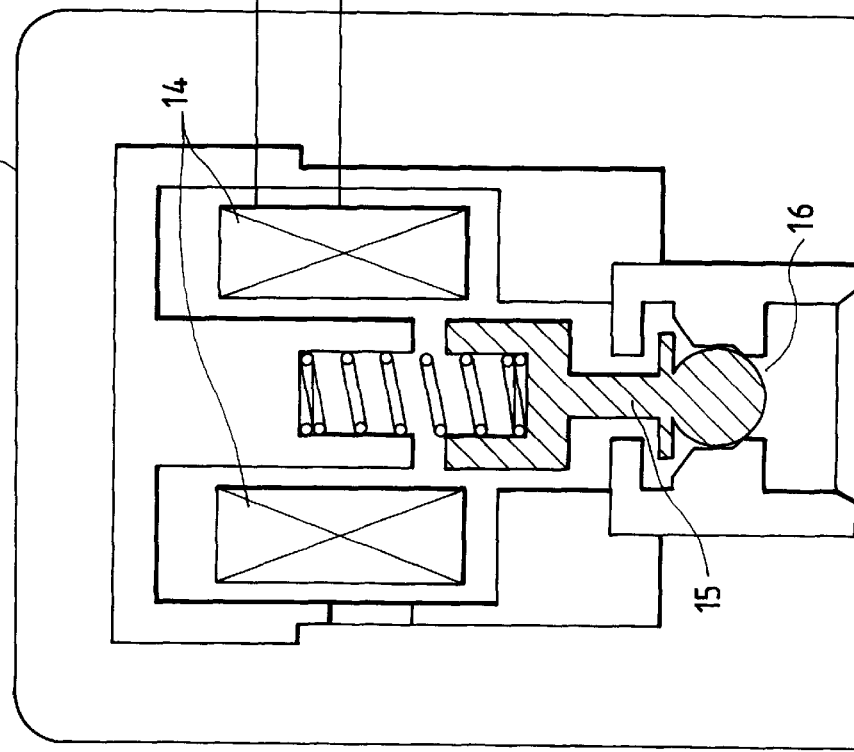

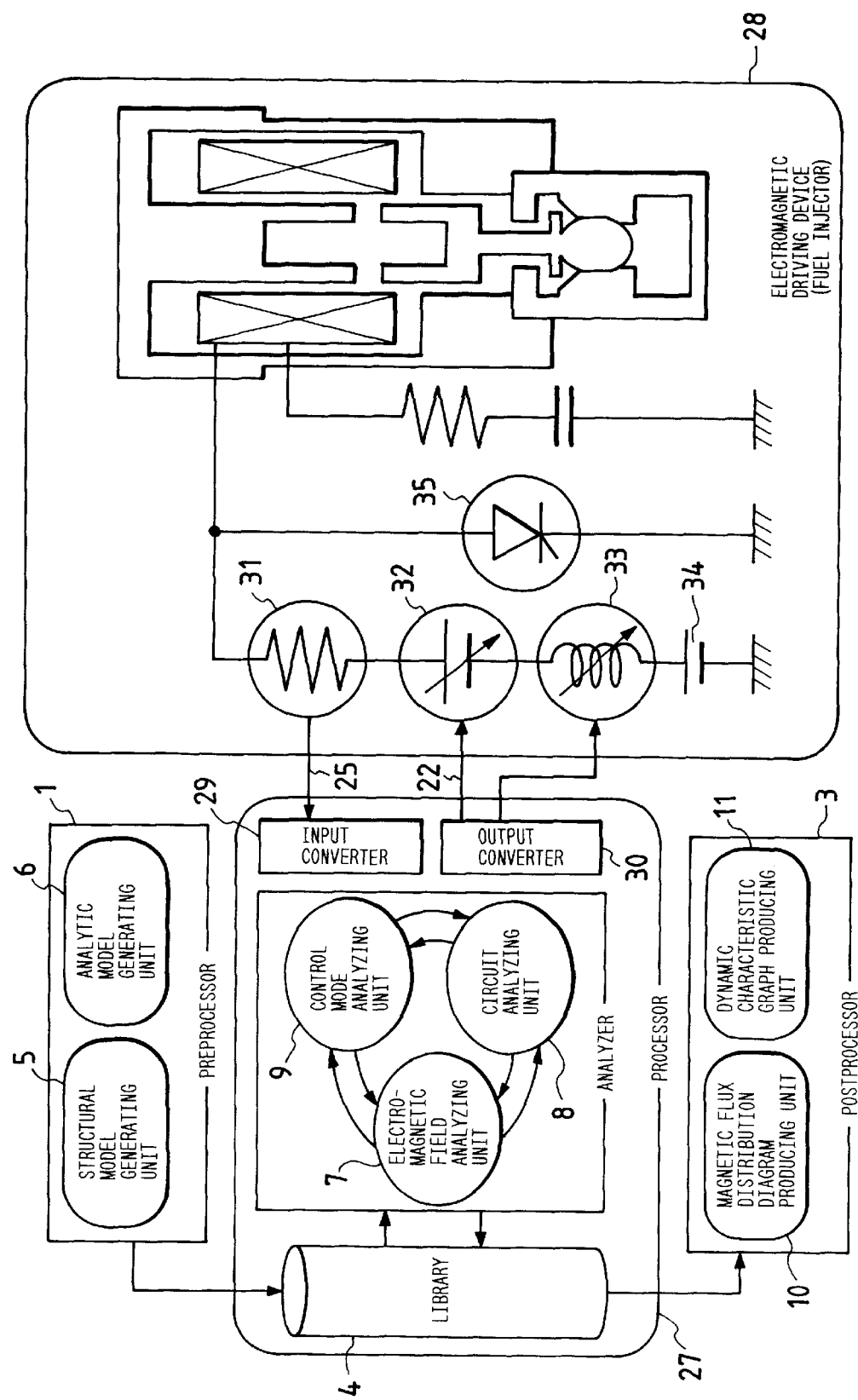

ELECTROMAGNETIC DRIVING SYSTEM FOR CONTROLLING ELECTROMAGNETIC DRIVING DEVICE BY SIMULATOR

BACKGROUND OF THE INVENTION

1. Field of the Invention

The present invention relates to an electromagnetic driving system for controlling an electromagnetic driving device by a simulator and, more particularly, to an electromagnetic driving system for controlling an electromagnetic driving device by a simulator, capable of controlling the electromagnetic driving device for an optimum operation by using a simulation system capable of analyzing the individual conditions of the electromagnetic mechanism, the circuit and the controller of the electromagnetic driving device.

2. Description of the Prior Art

The recent rapid progress of power electronics technology has created an electromagnetic driving device, such as a fuel injector that controls fuel supply for an automobile, having a complex configuration and has enabled remarkable increase in output density.

It is very difficult to measure the transient condition of such an electromagnetic driving device, such as the fuel injector, during operation and to estimate the dynamic characteristics of the various component of electromagnetic driving devices with high accuracy. Recently, attempts have been made to improve the efficiency and rationalization of the work for designing the electromagnetic driving device by simulating the electromagnetic driving device, using computer technology.

There have been proposed some simulators taking into consideration the combination of an electric circuit system and a control system, in electrical apparatuses. A known simulator disclosed in Japanese patent Laid-open (Kokai) No. 4-175972 expresses the circuit analysis of the components of the electric circuit system and that of the control system by state equations, respectively, combines the state equations in simultaneous equations and solves the simultaneous equations for circuit analysis at each time. Another known simulator disclosed in Japanese Patent Laid-open (Kokai) No. 4-218784 combines a state equation expressing the state of the interior of a semiconductor device and an operation equation expressing an external circuit connected to the semiconductor device by using current and voltage as intermediate parameters, and simulates the dynamic characteristics of the semiconductor device by correcting a calculated value calculated by using one of the equations and giving the initial values of the intermediate parameters to the other equation for the next time variation.

A still another known simulator taking into consideration the combination of a system of electric circuits and a system of magnetic mechanisms of an electrical apparatus is described in "Kaitenki, Seishiki Godo Kenkyu-kai, RM-85-57, SA-85-66", pp. 95–104. This known simulator provides a method of analyzing a magnetic field created in an electrical apparatus connected to a capacitor by setting the quantity of electric charge as an unknown quantity.

There are other known methods of analyzing the dynamic characteristics including the displacement of an object in an electromagnetic mechanism connected to an electric circuit: a magnetic path assumption method which creates an equivalent circuit model of the electric circuit, determines the magnetic reluctances according to the physical properties and the shape of an object, and analyzes the dynamic characteristics of the electromagnetic mechanism on the basis of the value of the magnetic reluctance, and an experimental data reference method which uses experimental data of current and electromagnetic force corresponding to displacement and determines electromagnetic force on the basis of the experimental data of current and displacement.

Generally, in the operation of an electromagnetic driving device for example, a voltage is applied to the electric circuit to supply a current to the electric circuit, the current flowing through the electric circuit creates a magnetic field in the electromagnetic mechanism to produce an electromagnetic force. The electromagnetic force drives an object for movement and the movement of the object induces a voltage, whereby the inductance is changed. For such an electromagnetic driving device which performs the foregoing operations, circuit analysis, control mode analysis, magnetic field analysis and other analyses conforming to the actual operating condition of the electromagnetic driving device must be integrated to carry out highly accurate simulation of dynamic characteristics in addition to the simple simulation of the combination of circuit analysis and control mode analysis, and the combination of circuit analysis and magnetic field analysis.

When simultaneously solving the electromagnetic equation, the circuit equation and the state equation by the aforesaid known simulator disclosed in Japanese Patent Laid-open (Kokai) No. 4-175972, a very large matrix is produced and complicated programs are necessary for analysis, and, when the design of the electromagnetic driving device is changed, the aforesaid equations must be simultaneously solved again and all the programs for analysis must be altered. Thus, the known simulator disclosed in Japanese Patent Laid-open (Kokai) No. 4-175972, similarly to the known magnetic pass assumption method which produces a plurality of models by a trial-and-error method and the known experimental data reference method which needs to obtain experimental data beforehand, is not efficient from the viewpoint of reducing time necessary for designing the simulator and reducing the design cost, and has a problem that the analytic models cannot be readily changed.

The foregoing problem can be tentatively solved by the aforesaid known simulator disclosed in Japanese Patent Laid-open (Kokai) No. 4-218784 which combines the state equation expressing the state of the interior and the operation equation expressing the operation of the external circuit using voltage and current as parameters, corrects calculated values calculated by using one of the equations and gives the corrected values to the other equation for the next time variation. However, when combining the equations by the parameters, necessary and sufficient parameters must be used to achieve all the analyses of the electrical devices functionally. Nevertheless, the aforesaid known simulator disclosed in Japanese Patent Laid-open (Kokai) No. 4-218784 takes nothing about the-effect of a change caused by the operation of the control system on the change of the characteristics, such as the inductance, of the electric circuit into consideration, and does not take necessary and sufficient parameters into consideration.

Furthermore, the aforesaid known simulators only provide the results of simulation of dynamic characteristics for the confirmation of experimental results and for the simulation of expected values, and do not reflect the results of simulation on the control of a practical electromagnetic driving device.

SUMMARY OF THE INVENTION

The present invention has been made to solve those problems and it is therefore an object of the present invention to provide an electromagnetic driving system for controlling an electromagnetic driving device by a simulator, capable of simulating the dynamic characteristics of the electromagnetic driving device efficiently and with high accuracy, and of practically reflecting the results of the simulation on the control of the electromagnetic driving device.

With the foregoing object in view, the present invention provides an electromagnetic driving system for controlling an electromagnetic driving device by a simulator, comprising: a simulation system comprising: a preprocessor for generating initial data used in the simulation; a analyzer for executing coupling analyses for magnetic field analysis, circuit analysis and control mode analysis; a postprocessor for displaying the output data of this system on a display; and a library for storing data given to and provided by the system; and the simulation system being combined with the electromagnetic driving device to control the electromagnetic driving device.

The preprocessor and the postprocessor are connected through the library to the analyzer.

The present invention also provides an electromagnetic driving system for controlling an electromagnetic driving device by a simulator, comprising: a simulation system comprising: a preprocessor; an analyzer comprising an electromagnetic field analyzing unit for analyzing the condition of an electromagnetic field created in an electromagnetic mechanism included in the electromagnetic driving device, a circuit analyzing unit for analyzing the condition of a circuit included in the electromagnetic driving device, and a control mode analyzing unit for analyzing the control mode of a control unit included in the electromagnetic driving device; a postprocessor; and a library through which the preprocessor and the postprocessor are connected to the analyzer; and the simulation system being combined with the electromagnetic driving device to control the electromagnetic driving device.

The electromagnetic field analyzing unit, the circuit analyzing unit and the control mode analyzing unit are interconnected through intermediate parameters. The intermediate parameters express at least one of current, inductance, induced voltage, force and displacement.

When the simulation system performs simulation by the analyzer comprising the electromagnetic field analyzing unit, the circuit analyzing unit and the control mode analyzing unit, one parameter, for example, a current, is transferred from the circuit analyzing unit to the electromagnetic field analyzing unit, two parameters, for example, a voltage and an inductance, are transferred from the electromagnetic field analyzing unit to the circuit analyzing unit, one parameter, for example, an electromagnetic force, is transferred from the electromagnetic field analyzing unit to the control mode analyzing unit, and one parameter, for example, a displacement, is transferred from the control mode analyzing unit to the electromagnetic field analyzing unit. The electromagnetic field analyzing unit, the circuit analyzing unit and the control mode analyzing unit execute analyses independently and obtain calculated values in each time variation. Therefore, processes necessary to meet the change of the design of the electromagnetic driving device are simplified. Since the values obtained by analyses are corrected during calculation, the dynamic characteristics can be highly accurately simulated.

Since the aforesaid means use this simulation system and obtain calculated values to be given to the electromagnetic driving device using the results of simulation and initial values given thereto from the electromagnetic driving device, the optimum control of the practical electromagnetic driving device is possible on the basis of the results of simulation.

BRIEF DESCRIPTION OF THE DRAWINGS

FIG. 2 is a diagrammatic view showing an analysis of the solenoid valve of a fuel injector, which controls the quantity of fuel to be injected for an automobile or the like, by the simulation system shown in FIG. 1.

FIG. 6 is a block diagram of an electromagnetic driving system for controlling an electromagnetic driving device by a simulator in a preferred embodiment according to the present invention.

EMBODIMENTS

A preferred embodiment of the present invention will be described in detail hereinafter with reference to the accompanying drawings.

Figure 1:
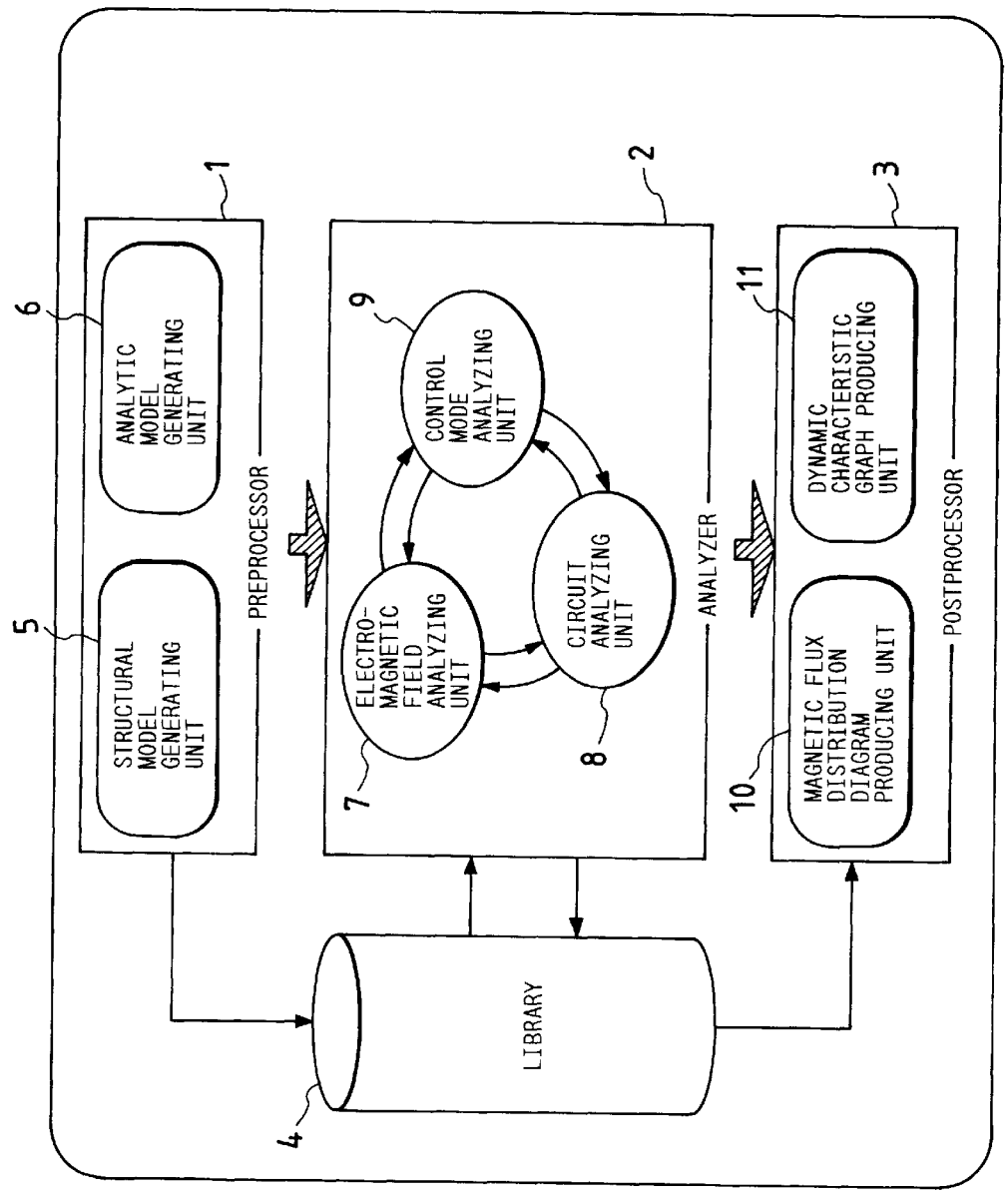
FIG. 1 is a block diagram of a simulation system employed in an electromagnetic driving system of the present invention.

FIG. 1 is a block diagram of a simulation system employed in an electromagnetic driving system in accordance with the present invention.

Shown in FIG. I are a preprocessor 1, an analyzer 2, a postprocessor 3, a library 4, a structural model generating unit 5, an analytic model generating unit 6, an electromagnetic field analyzing unit 7, a circuit analyzing unit 8, a control mode analyzing unit 9, a magnetic flux distribution diagram producing unit 10 and a dynamic characteristic graph producing unit 11.

The simulation system comprises the preprocessor 1 which generates input data to be applied to this system, the analyzer 2 which executes coupling analyses for magnetic field analysis, circuit analysis and control mode analysis, the postprocessor 3 which displays the output data of this system on a display, not shown, and the library 4 which stores data given to and provided by this system. The preprocessor 1 and the postprocessor 3 are connected through the library 4 to the analyzer 2. The preprocessor 1 comprises the structural model generating unit 5 and the analytic model generating unit 6. The structural model generating unit 5 is used for designing the shapes of the components of the electromagnetic driving device, the data of materials, boundary conditions and such on the screen of the display in an interactive mode. The analytic model generating unit 6 displays the circuit models of the components of the electromagnetic driving device, control models, the data input/output relation between the analyzing units 7 to 9, and the data-sensitive relation by symbols on the screen for designing in an interactive mode. The analyzer 2 comprises the electromagnetic field analyzing unit 7, the circuit analyzing unit 8 and the control mode analyzing unit 9. The electromagnetic field analyzing unit 7, the circuit analyzing unit 8 and the control mode analyzing unit 9 are interconnected by using parameters, such as values expressing current, inductance, induced voltage, force and displacement. The magnetic field analyzing unit 7 executes analyses based on the electromagnetic operations of the electromagnetic mechanism in the electromagnetic driving device. The circuit analyzing unit 8 executes analyses based on the operation of the component circuits in the electromagnetic driving device. The control mode analyzing unit 9 executes analyses based on the control operation of the control unit in the electromagnetic driving device. The postprocessor 3 comprises the magnetic flux distribution diagram producing unit 10 and the dynamic characteristic graph producing unit 11. The magnetic flux distribution diagram producing unit 10 displays a contour map and a vector diagram representing the distribution of magnetic flux density obtained by an analysis. The dynamic characteristic graph producing unit 11 calculates voltage, current, displacement and such and indicates the calculated values in a dynamic mode.

The input data generated by the structural model generating unit 5 and/or the analytic model generating unit 6 of the preprocessor 1 is given properly to and stored in the library 4. The analyzer 2 reads the data stored in the library 4 and carries out various analyses using the data read from the library 4. In the analyzer 2, the electromagnetic field analyzing unit 7 analyzes the electromagnetic operations of the electromagnetic mechanism of the electromagnetic driving device, the circuit analyzing unit 8 analyzes the electric circuit operations of the circuit of the electromagnetic driving device, the control mode analyzing unit 9 analyzes the control operations of the control unit of the electromagnetic driving device. The results of those analyses are given to and stored in the library 4. The postprocessor 3 reads those data stored in the library 4, and the magnetic flux distribution diagram producing unit 10 and/or the dynamic characteristic graph producing unit 11 displays the data in diagrams and graphs on the display.

The data given to the structural model generating unit 5 of the preprocessor 1 include those of the field of analysis, the definition of shape, element partition, control, subregion, attribute, boundary conditions and such. The data given to the analytic model generating unit 6 include those of diagrams of input/output relation, programs of analyses, electric circuit diagrams, block diagrams and such.

FIG. 2 is a diagrammatic view showing an analysis of the solenoid valve of a fuel injector, which controls the quantity of fuel to be injected for an automobile or the like, by the simulation system shown in FIG. 1.

Shown in FIG. 2 are a structural model 12 of the solenoid valve of the fuel injector, an equivalent electric circuit 13 of the fuel injector, a coil 14, a plunger 15, a solenoid valve 16, a power supply 17, a switching transistor 18, a variable resistor 19 and a variable capacitor 20.

The structural model 12 of the solenoid valve of the fuel injector, which represents the sectional structure of the fuel injector including the solenoid valve 16, comprises the coil 14 which is energized intermittently, the plunger 15 which is driven for vertical movement by the electromagnetic force generated by the energized coil 14, and the solenoid valve 16 which is opened and closed by the vertical movement of the plunger 15. The equivalent electric circuit 13 of the fuel injector comprises the power supply 17 for energizing the coil 14, the switching transistor 18 for intermittently interrupting the current supplied to the coil 14, a variable resistor 19 for regulating the rising and falling of the current supplied to the coil 14, and the variable capacitor 20.

The equivalent electric circuit 13 of the fuel injector supplies a driving current intermittently to the coil 14 in the structural model 12 of the solenoid valve of the injector in synchronism with the on-off operation of the switching transistor 18. When the driving current is supplied to the coil 14 to energize the coil 14, the coil 14 generates magnetic force and raises the plunger 15 against the resilience of a spring to open the solenoid valve 16. When the supply of the driving current to the coil 14 is stopped, the magnetic force of the coil 14 disappears, and then the plunger 15 is moved down by the resilience of the spring to close the solenoid valve 16. The solenoid valve 16 is opened and closed to regulate the quantity of fuel to be injected into the engine-of the automobile. The switching transistor 18 of the equivalent electric circuit 13 of the fuel injector is turned on and off at a period of about 20 ms. The quantity of fuel to be injected is substantially proportional to the duration of the ON-state of the switching transistor 18.

The data given to the structural model generating unit 5 of the preprocessor 1 include those of injector shape (mesh partition diagram), conditions for analysis, conditions for calculation, materials of the coil 14 and the plunger 15, boundary specifying segment coordinates and such. The data given to the analytic model generating unit 6 include those of current, displacement of the plunger 15, inductance, voltage, the electromagnetic force of the coil 14, supply voltage, gate signal, capacitance, resistance, mass of the plunger 15, spring constant, damping coefficient, restitution coefficient, resilience, gap and such.

The data given to the magnetic flux distribution diagram producing unit 10 of the postprocessor 3 is the data of magnetic flux density distribution in the fuel injector. The data given to the dynamic characteristic graph producing unit 11 include those of a graph indicating the displacement of the plunger 15, and a graph indicating dynamic characteristics of gate signal, current, voltage inductance, electromagnetic force (magnetic attraction) and such.

Figure 3:
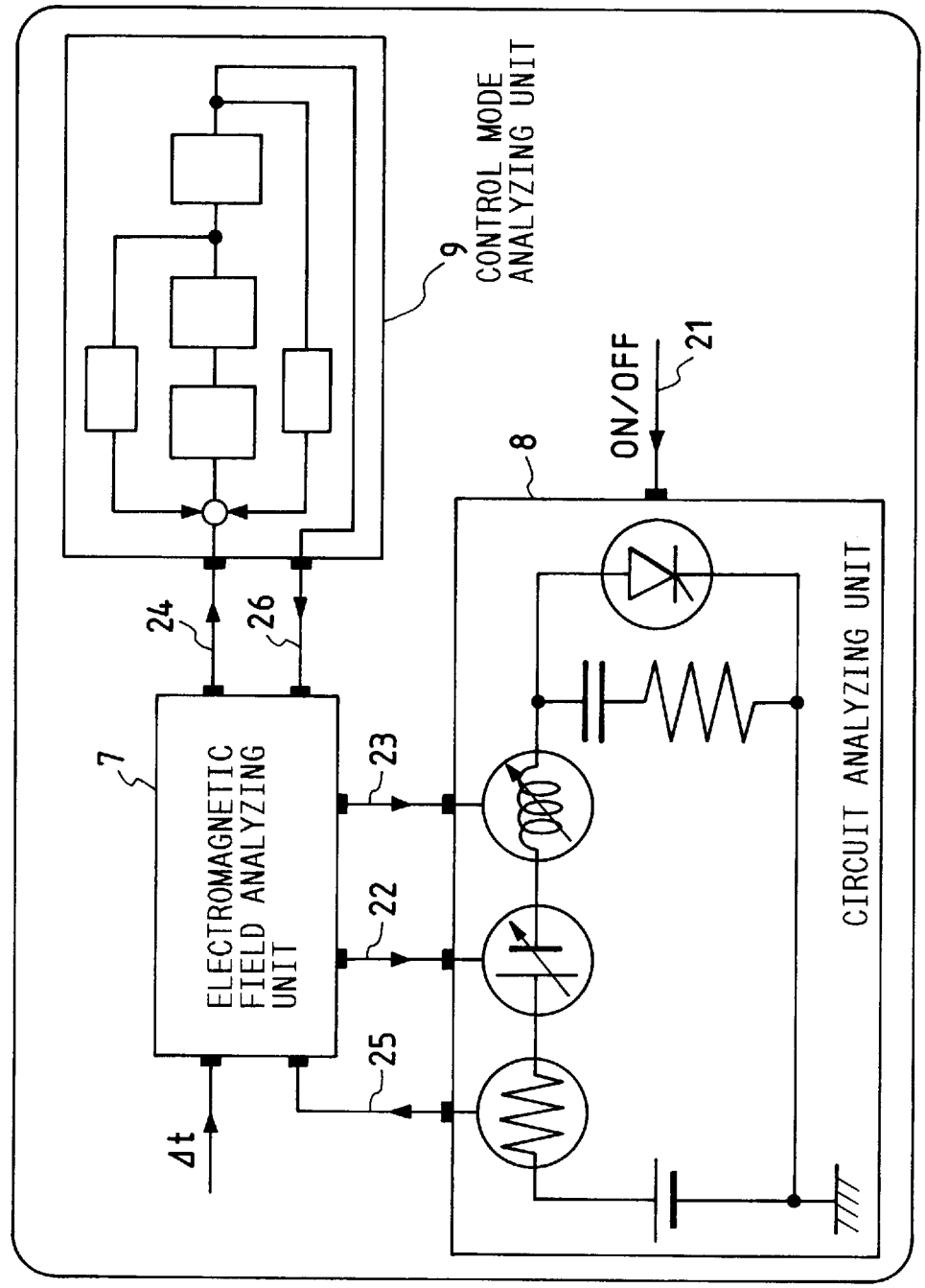
FIG. 3 is a block diagram of an analytic model generated by the simulation system shown in FIG. 1 in analyzing a solenoid valve.

FIG. 3 shows, by way of example, a block diagram of an analytical model generated by the simulation system shown in FIG. 1 in analyzing a solenoid valve.

Shown in FIG. 3 are a gate signal transmission line 21, a first line 22, i.e., an induced voltage signal transmission line, a second line 23, i.e., an inductance signal transmission line, a third line 24, i. e., an electromagnetic force signal transmission line, a fourth line 25, i.e., a current signal transmission line, and a fifth line 26, i.e., a plunger displacement signal transmission line. In FIG. 3, the components corresponding to those shown in FIG. 1 are designated by the same reference characters.

The electromagnetic field analyzing unit 7 and the circuit analyzing unit 8 are interconnected by the first line 22, the second line 23 and the fourth line 25. The electromagnetic field analyzing unit 7 and the control mode analyzing unit 9 are interconnected by the third line 24 and the fifth line 26. The circuit analyzing unit 8 is connected by the gate signal transmission line 21 to an external circuit, not shown.

The electromagnetic field analyzing unit 7, indicated by a block provided with input/output terminals, executes calculations for each time variation $\Delta t$ using input parameters including a current, i.e., a current flowing across the resistor in the circuit analyzing unit 8, given thereto through the fourth line 25 and a plunger displacement, i.e., a displacement of the plunger of the control mode analyzing unit 9, given thereto through the fifth line 26, gives the calculated induced voltage, which is indicated by an equivalent variable voltage source in the circuit analyzing unit 8, and the calculated inductance, which is indicated by a variable inductance in the circuit analyzing unit 8, through the first line 22 and the second line 23 to the circuit analyzing unit 8, and gives a calculated electromagnetic force through the third line 24 to the control mode analyzing unit 9. The circuit diagram of the circuit analyzing unit 8 shows the circuit components. The circuit analyzing unit 8 executes calculations for each time variation Δt using the input parameters including the induced voltage given thereto through the first line 22 and the inductance given thereto through the second line 23 by the electromagnetic field analyzing unit 7 and a gate signal for controlling the opening and closing of the solenoid valve given thereto through the gate signal transmission line 21, and gives a calculated current through the fourth line 25 to the electromagnetic field analyzing unit 7. The control mode analyzing unit 9, indicated by a block diagram showing the control elements thereof, executes calculation for each time variation Δt using input parameters including an electromagnetic force given thereto through the third line 24, and gives a calculated plunger displacement through the fifth line 26 to the electromagnetic field analyzing unit 7.

The electromagnetic field analyzing unit 7 of the analyzer 2 is able to analyze shape, physical properties of materials (magnetization curve and resistivity) and winding (number of turns, position, and splicing method). The circuit analyzing unit 8 is able to analyze circuit connection diagrams, values representing the properties of the elements (resistance, inductance and capacitance) and a gate signal to be applied to the switching device (pulse width). The control mode analyzing unit 9 is able to analyze the characteristics of the plunger (spring constant, damping coefficient, mass, coefficient of inertia, restitution coefficient and stroke).

Although the blocks and the respective configurations of the analyzing units are shown in plan view in this analytic model shown by way of example, the constructions may be hierarchically described and indicated if necessary.

The simulation system described above carries out various analyses by the following methods.

An electromagnetic field analyzing method to be carried out by the electromagnetic field analyzing unit 7 analyzes two-dimensional transient electromagnetic fields by, for example, a finite element method, and uses the following equation (1) expressing vector potential A neglecting displacement current from the Maxwell electromagnetic equation.

$$\frac{\partial}{\partial x}\left(\frac{1}{\mu y}\frac{\partial A}{\partial x}\right) + \frac{\partial}{\partial x}\left(\frac{1}{\mu x}\frac{\partial A}{\partial x}\right) = Jm + Je + Jo \quad (1)$$

In equation (1), $\mu x$ and $\mu y$ are the magnetic permeabilities along the x-axis and the y-axis, respectively, of the material of the plunger, Jm is magnetizing current for magnetizing the material, Je is the eddy current induced in the material and Jo is current supplied to the material. In this case, the method is converted into a method which moves the plunger parametrically by straining the external element of the vertically movable plunger, and the linear movement of the plunger is analyzed.

An electric circuit analyzing method to be carried out by the circuit analyzing unit 8 assumes an electric circuit network to be a graph and solves the graph on the basis of a graph algorithm to obtain the following equations (2) and (3).

$$\frac{d}{dt} q = f1\ (H, Ii, Ir, Il) \quad (2)$$

-continued
$$\frac{d}{dt} \Phi = f2\ (H, Ve, Vg, Vc) \quad (3)$$

In equations (2) and (3), H is cut set matrix, I is current, V is voltage, q and Φ are state variables, and subscripts i, r, g, l, e and c suffixed to current I and voltage V indicate current source, resistance, resistance, inductance, voltage source and capacitance, respectively.

A control mode analyzing method to be carried out by the control mode analyzing unit 9 indicates the control system in a block diagram and develops the control elements in integration elements to obtain the following equation (4).

$$\frac{d}{dt} X = A \cdot X + B \cdot U \quad (4)$$

In equation (4), X is output state vector, U is input control vector, A is system matrix, and B is control matrix.

When the circuit analyzing unit 8 and the control mode analyzing unit 9 analyze the electric circuit and the control system by the aforesaid analyzing methods, respectively, the constants of the gain elements and source elements included in the block diagram are changed according to the voltages applied to the circuit elements and currents flowing through the circuit elements, and the characteristics of the circuit elements are changed according to signals provided by the control mode analyzing unit 9. Equations (2) and (3) may be expressed by functions including state vector x, for equation (4), system matrix A, control matrix B and input control vector U may be expressed by functions of state variables q and Φ and equations (2), (3) and (4) may be solved as simultaneous equations.

When these analyses are performed by coupled analyses, the internal state of each analysis is dependent on the preceding internal states of the other two analyses.

Supposing that n is an input from the control mode analyzing unit 9 to the electromagnetic field analyzing unit 7, y is an input from the circuit analyzing unit 8 to the electromagnetic field analyzing unit 7, x is an output from the electromagnetic field analyzing unit to the control mode analyzing unit 9, 1 is an output from the electromagnetic field analyzing unit 7 to the circuit analyzing unit 8, and α is the internal state of the electromagnetic field analyzing unit 7, the following equations are obtained.

$xn=f1\ (nn-1, yn-1, an-1)$ $ln=f2\ (nn-1, yn-1, an-1)$ $an=f3\ (nn-1, yn-1, an-1)$

Similarly, supposing that 1 is an input from the electromagnetic field analyzing unit 7 to the circuit analyzing unit 8, z is an input from the control mode analyzing unit 9 to the circuit analyzing unit 8, y is an output from the circuit analyzing unit 8 to the electromagnetic field analyzing unit 7, m is an output from the circuit analyzing unit 8 to the control mode analyzing unit 9, β is the internal state of the circuit analyzing unit 8, and electromagnetic field analysis is executed once every d steps of circuit analysis (D=1/d) taking into consideration that the time constant of electromagnetic phenomenon in an electromagnetic field is large as compared with the time constant of circuit analysis., the following expressions are obtained.

$yn=g1\ (in-1, zn-1, βn-D)$ $mn=g2\ (ln-1, zn-1, βn-1)$ $$\beta n = g3\ (In-1, zn-1, \beta n-D)$$

Supposing that m is an input from the circuit analyzing unit 8 to the control mode analyzing unit 9, x is an input from the electromagnetic field analyzing unit 7 to the control mode analyzing unit 9, z is an output from the control mode analyzing unit 9 to the circuit analyzing unit 8, n is an output from the control mode analyzing unit 9 to the electromagnetic field analyzing unit 7, and γ is the internal state of the control mode analyzing unit 9, the following expressions are obtained.

$$zn = g1\ (mn-1, xn-1, \gamma n-1)$$

$$nn = g2\ (mn-1, xn-1, \gamma n-1)$$

$$\gamma n = g3\ (mn-1, xn-1, \gamma n-1)$$

Figure 4:
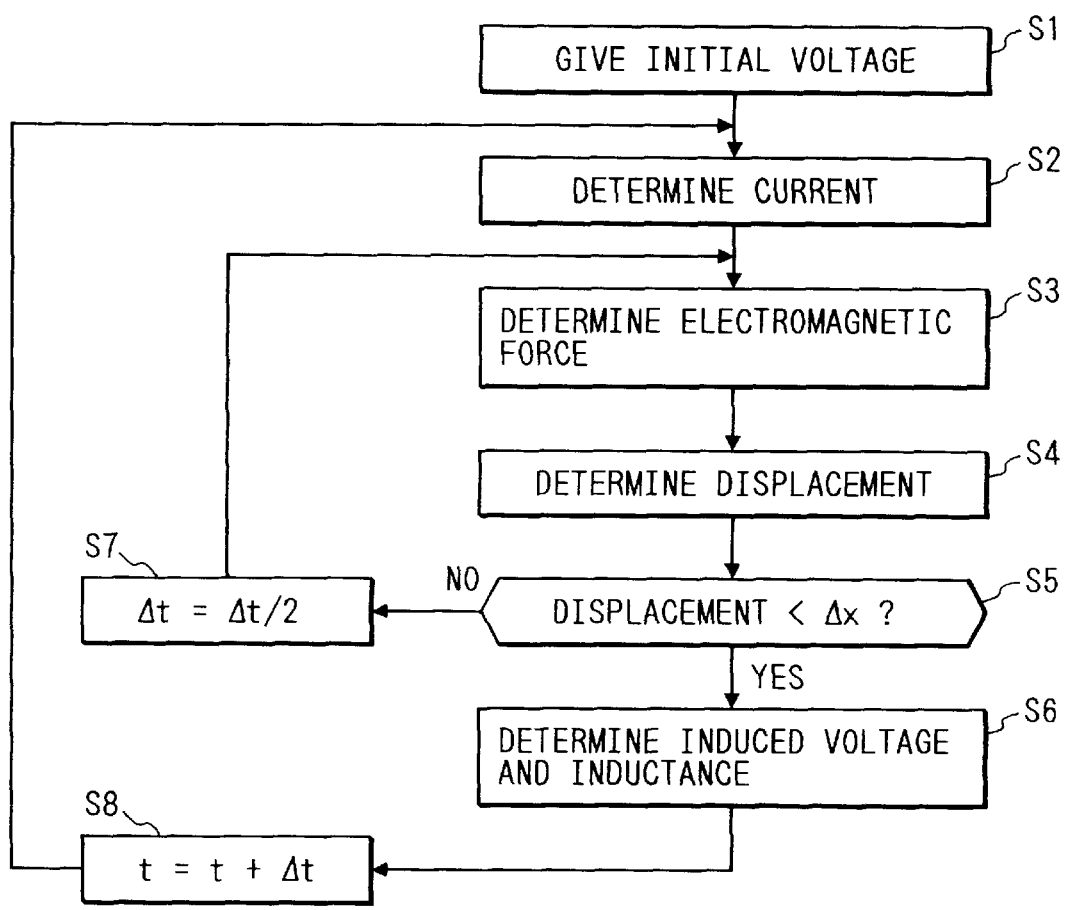
FIG. 4 is a flow chart of a program to be executed in analyzing the analytic model shown in FIG. 3.

Next, FIG. 4 is a flow chart of a program to be executed in analyzing the analytic model shown in FIG. 3.

The program expressed by the flow chart has the following steps.

In step S1, an initial voltage is applied to the electric circuit of the circuit analyzing unit 8.

In step S2, the circuit analyzing unit measures a current flowing through the resistor, and gives a current signal representing the measured current to the electromagnetic field analyzing unit 7 through the fourth line 25.

In step S3, the electromagnetic field analyzing unit 7 determines the magnitude of magnetic flux and that of electromagnetic force (magnetic attraction) and gives a magnetic force signal representing the determined magnitude of magnetic force to the control mode analyzing unit 9.

In step S4, the control mode analyzing unit 9 obtains the vertical displacement of the plunger of the solenoid valve 16.

In step S5, a query is made to see whether or not the vertical displacement is greater than an allowable value $\Delta x$. Step S6 is executed if the vertical displacement is greater than the allowable value $\Delta x$, i.e., if the response in step S5 is affirmative (Y) or step S7 is executed if the vertical displacement is not greater than the allowable value $\Delta x$, i.e., the response in step S5 is negative (N).

In step S6, the magnitude of magnetic flux determined by the electromagnetic field analyzing unit 7 is converted into a corresponding induced voltage, the displacement determined by the electromagnetic field analyzing unit 7 into a corresponding inductance, and then an induced voltage signal representing the induced voltage and an inductance signal representing the inductance are sent through the first line 22 and the second line 23, respectively to the circuit analyzing unit 8.

In step S7, the time variation is changed from $\Delta t$ to $\Delta t/2$, the program returns to step S3, and then steps S3 through S5 are executed again.

In step S8, analysis for one time variation $\Delta t$ is ended, and then analysis for the next time variation $\Delta t$ is started. Thus, analysis for the time variation $\Delta t$ is executed repeatedly in a specified time for analysis.

Figure 5:
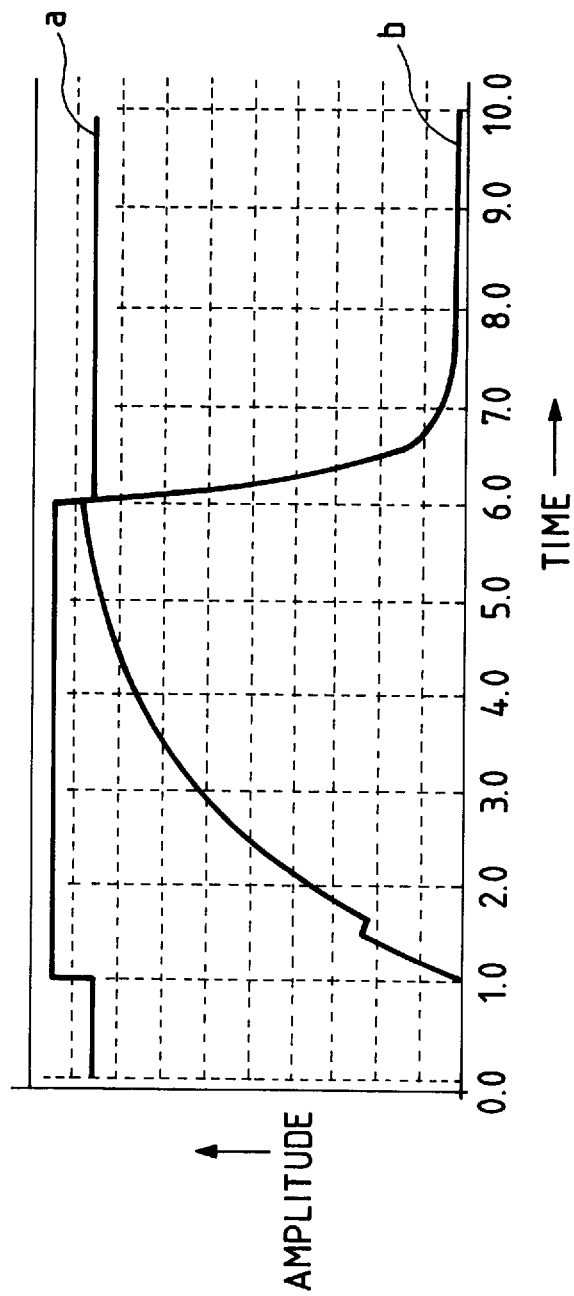
FIG. 5 is a graph showing some of the results of analytic output of a solenoid valve by the simulation system shown in FIG. 1.

FIG. 5 is a graph showing, by way of example, some of the results of analytic output of the solenoid valve by the simulation system shown in FIG. 1.

In FIG. 5, the respective amplitudes of the gate signal a and the current signal b given to the electromagnetic field analyzing unit 7 are measured upward on the vertical axis, and time is measured on the horizontal axis.

As is obvious from FIG. 5, the amplitude of the current signal b given to the electromagnetic field analyzing unit 7 increases gradually from zero after the gate signal a has risen and until the the gate signal a starts falling. The amplitude of the current signal b decreases sharply after the gate signal a has fallen and returns to zero in a short time.

The results of analysis representing the relation between the various parameters, as well as the relation between the gate signal a and the current signal b given to the electromagnetic field analyzing unit 7, can be similarly indicated. Since the indication of the results of the analysis enables the indication of the dynamic state while the parameters, such as voltage, current, displacement and such, are being analyzed, it is possible to evaluate the analysis during analysis.

As mentioned above, the fuel injector for an automobile must accurately control the quantity of fuel to be injected. As mentioned above, the quantity of fuel to be injected is controlled through the control of the duration of the open state of the solenoid valve 16 of the fuel injector, and the duration is dependent on the pulse width of the ON-signal applied to the switching transistor 18 shown in FIG. 2. In some cases, the quantity of fuel to be injected changes, whereas the pulse width of the ON-signal to be applied to the switching transistor 18 is kept constant, which is due to the variation of friction in the fuel injector.

In such a case, the movement of the plunger of the solenoid valve 16 can be accurately controlled if the movement of the valve unit of the injector, i.e., the vertical movement of the plunger of the solenoid valve 16 of the injector can be directly measured. Practically, it is very difficult to incorporate a sensor for detecting the movement of the plunger of the solenoid valve 16 into the valve unit of the injector because the valve unit of the injector has small dimensions.

The inventors of the present invention have employed a simulation system as shown in FIG. 1 in constructing an electromagnetic driving system for controlling the electromagnetic driving device, such as a fuel injector, and have achieved the control of the operations of the components of the fuel injector and the control mode by the simulation system.

FIG. 6 is a block diagram of an electromagnetic driving system for controlling an electromagnetic driving device by a simulator in a preferred embodiment according to the present invention. In this example, the electromagnetic driving device is a fuel injector.

Shown in FIG. 6 are a processor 27, an electromagnetic driving device 28, i.e., a fuel injector, an input converter 29, an output converter 30, a resistor 31, a variable voltage power supply 32, a variable inductance 33, a power supply 34 and a thyristor 35. In FIG. 6, components like or corresponding to those shown in FIGS. 1 to 3 are designated by the same reference characters.

The processor 27 comprises an analyzer 2 and a library 4, which are the same in configuration as those shown in FIG. 1, the input converter 29 and the output converter 30. The electromagnetic driving device 28, which is a fuel injector for an automobile or the like, capable of controlling the quantity of fuel to be injected, comprises a fuel injector and a driving circuit thereof. The driving circuit of the fuel injector has a series circuit consisting of the resistor 31, the variable voltage power supply 32, the variable inductance 33 and the power supply 34. The thyristor 35 is connected in parallel to this series circuit. The input converter 29 of the processor 27 is connected to the resistor 31 of the electromagnetic driving device 28 by the fourth line 25, and the output converter 30 of the processor 27 is connected to the variable voltage power supply 32 and the variable inductance 33 by the first line 22 and the second line 23, respectively.

The electromagnetic driving system in this embodiment thus constructed operates in the following manner.

When the electromagnetic driving system controls the electromagnetic driving device, such as the fuel injector, by using the simulation system, data for producing an analytic model and a structural model of the controlled electromagnetic driving device (fuel injector) are given beforehand to the preprocessor I of the simulation system. The data is transferred to the library 4 to make the analyzer 2 produce the analytic model and the structural model. The electromagnetic driving device is driven for operation, dynamic input data (in this case, a current signal representing a current that flows through the resistor 31) obtained during the operation is transferred through the fourth line 25 and the input converter 29 to the processor 27. The processor 27 analyzes the input current signal by the circuit analyzing unit 8 and the like of the analyzer 2, and then transfers output data obtained through analysis (in this case, an induced voltage signal representing an induced voltage) through the output converter 30 and the first line 22 to the variable voltage power supply 32. Then, the variable voltage power supply 32 generates a voltage corresponding to the induced voltage to regulate the current flowing through the resistor 31.

Then, the processor 27 receives again a current signal representing the current flowing through the resistor 31 through the fourth line 25 and the input converter 29, executes the same analysis and sends an induced voltage signal representing an induced voltage determined by analysis through the output converter 30 and the first line 22 to the variable voltage power supply 32. Then, the variable voltage power supply 32 changes the supply voltage according to the induced voltage signal to regulate again the current flowing through the resistor 31.

The processor 27 repeats the same operations for receiving a current signal representing the current flowing through the resistor 31 and sending an induced voltage signal representing an induced voltage determined by the analysis of the processor 27 to the variable voltage power supply 32, to regulate the current flowing through the resistor 31 through the regulation of the supply voltage of the variable voltage power supply 32.

The processor 27 transfers an output data (in this case, an inductance) obtained by analyzing the input current signal by the electromagnetic field analyzing unit 7 through the output converter 30 and the second line 23 to the variable inductance 33. Then, the variable inductance 33 is set for an inductance corresponding to the inductance signal given thereto, whereby the rising or falling characteristics of the current flowing through the resistor 31 is regulated accordingly.

The processor 27 continues the foregoing operations. The frictional force of the solenoid valve of the fuel injector can be estimated from the history of the current signal given to the processor 27. The simulation system not only is able to calculate the position of the plunger of the solenoid valve accurately, but to estimate the movement of the plunger of the solenoid valve and the quantity of fuel to be injected accurately by using the accurately determined frictional force as data for simulation. Consequently, the quantity of fuel to be injected for an automobile can be precisely controlled.

As is apparent from the foregoing description, when the simulation system employed in the present invention carries out simulation by the analyzer 2 comprising the electromagnetic field analyzing unit 7, the circuit analyzing unit 8 and the control mode analyzing unit 9, the parameters are transmitted between the electromagnetic field analyzing unit 7, the circuit analyzing unit 8 and the control mode analyzing unit 9 for the cooperative operation, the electromagnetic field analyzing unit 7, the circuit analyzing unit 8 and the control mode analyzing unit 9 execute analyses independently and a calculated value is obtained for each time variation. Therefore, processes necessary to meet the change of the design of the electromagnetic driving device are simplified. Since the values obtained by analyses are corrected during calculation, the dynamic characteristics can be highly accurately simulated.

Furthermore, since the present invention obtains calculated values to be given to the electromagnetic driving device on the basis of the results of simulation and initial values provided by the electromagnetic driving device using the aforementioned simulation system, the optimum control of the practical electromagnetic driving device is possible on the basis of the results of simulation. Still further, the present invention is capable of estimating and optimizing the performance of the electromagnetic driving device without requiring the trial manufacture and experimental operation of the electromagnetic driving device and, consequently, the performance of the electromagnetic driving device can be improved, the development cost can be curtailed and the curtailment of the time necessary for development can be expected.

What is claimed is:

1. An electromagnetic driving system for controlling an electromagnetic driving device by a simulator, said electromagnetic driving system including a simulation system comprising:

a preprocessor for generating initial data used in the simulation system;

an analyzer for executing coupling analyses for magnetic field analysis, circuit analysis and control mode analysis;

a postprocessor for displaying the output data of this system on a display; and a library for storing data given to and provided by the system;

the simulation system being combined with the electromagnetic driving device to control said electromagnetic driving device.

2. An electromagnetic driving system for controlling an electromagnetic driving device by a simulator, according to claim 1, wherein said preprocessor and said postprocessor are connected through said library to said analyzer.

3. An electromagnetic driving system for controlling an electromagnetic driving device by a simulator, according to claim 1, wherein said preprocessor comprises a structural model generating unit and an analytic model generating unit.

4. An electromagnetic driving system for controlling an electromagnetic driving device by a simulator, according to claim 1, wherein said postprocessor comprises a magnetic flux distribution diagram producing unit and a dynamic characteristic graph producing unit.

5. An electromagnetic driving system for controlling an electromagnetic driving device by a simulator, according to claim 1, wherein said analyzer further comprises an input converting unit and an output converting unit.

6. An electromagnetic driving system for controlling an electromagnetic driving device by a simulator, according to claim 1, wherein said electromagnetic driving device is a fuel injector for an automobile, capable of controlling fuel supply.

7. An electromagnetic driving system for controlling an electromagnetic driving device by a simulator, according to claim 1, wherein said analyzer comprises an electromagnetic field analyzing unit for analyzing the condition of an electromagnetic field created in an electromagnetic mechanism included in the electromagnetic driving device, a circuit analyzing unit for analyzing the condition of a circuit included in the electromagnetic driving device, and a control mode analyzing unit for analyzing the control mode of a control unit included in the electromagnetic driving device.

8. An electromagnetic driving system for controlling an electromagnetic driving device by a simulator, according to claim 7, wherein said electromagnetic field analyzing unit, said circuit analyzing unit and said control mode analyzing unit are interconnected through intermediate parameters.

9. An electromagnetic driving system for controlling an electromagnetic driving device by a simulator, according to claim 8, wherein said intermediate parameters are at least one of values expressing current, inductance, induced voltage, force and displacement.

10. An electromagnetic driving system for controlling an electromagnetic driving device by a simulator according to claim 7, wherein said analyzer further comprises an input converting unit and an output converting unit.

11. An electromagnetic driving system for controlling an electromagnetic driving device by a simulator, said electromagnetic driving system including a simulation system comprising:

a preprocessor;

an analyzer comprising an electromagnetic field analyzing unit for analyzing the condition of an electromagnetic field created in an electromagnetic mechanism included in the electromagnetic driving device, a circuit analyzing unit for analyzing the condition of a circuit included in the electromagnetic driving device, and a control mode analyzing unit for analyzing the control mode of a control unit included in the electromagnetic driving device;

a postprocessor; and a library through which said preprocessor and postprocessor are connected to said analyzer;

said electromagnetic field analyzing unit, said circuit analyzing unit and said control mode analyzing unit being interconnected through intermediate parameters;

the simulation system being combined with the electromagnetic driving device to control said electromagnetic driving device.

12. An electromagnetic driving system for controlling an electromagnetic driving device by a simulator according to claim 11, wherein said intermediate parameters are at least one of values expressing current, inductance, induced voltage, force and displacement.

13. An electromagnetic driving system for controlling an electromagnetic driving device by a simulator according to claim 11, wherein said preprocessor comprises a structural model generating unit and an analytic model generating unit.

14. An electromagnetic driving system for controlling an electromagnetic driving device by a simulator according to claim 11, wherein said post processor comprises a magnetic flux distribution diagram producing unit and a dynamic characteristic graph producing unit.

15. An electromagnetic driving system for controlling an electromagnetic driving device by a simulator according to claim 11, wherein said electromagnetic driving device is a fuel injector for an automobile, capable of controlling fuel supply.

* * * * *

UNITED STATES PATENT AND TRADEMARK OFFICE
CERTIFICATE OF CORRECTION

PATENT NO. : 5,812,433
DATED : September 22, 1998
INVENTOR(S) : Kaoru Kawabata, et. al.

It is certified that error appears in the above-identified patent and that said Letters Patent is hereby corrected as shown below:

| Column | Line | |
|---|---|---|
| 1 | 27 | Change "component" to --components--. |
| 2 | 39 | After "problem" insert --in--. |
| 2 | 53 | Change "the-effect" to --the effect--. |
| 3 | 12 | Change "a analyzer" to --an analyzer--. |
| 6 | 12 | Change "engine-of" to --engine of--. |
| 8 | 46 | Change "an-1)" to --$\alpha$n-1)--. |
| 8 | 48 | Change "an-1)" to --$\alpha$n-1)--. |
| 8 | 50 | Change "an-1)" to --$\alpha$n-1)--. |
| 8 | 61 | Before "electro-" insert --an--. |
| 8 | 63 | After "analysis" delete ".". |

UNITED STATES PATENT AND TRADEMARK OFFICE
CERTIFICATE OF CORRECTION

PATENT NO. : 5,812,433
DATED : September 22, 1998
INVENTOR(S) : Kaoru Kawabata, et. al.

It is certified that error appears in the above-identified patent and that said Letters Patent is hereby corrected as shown below:

| Column | Line | |
|---|---|---|
| 8 | 65 | Change "*(in-1,*" to --*(In-1,*--. |
| 10 | 1 | Delete "the" (second occurrence). |
| 11 | 8 | Change "preprocessor I" to --preprocessor 1--. |
| 11 | 50 | Change "is regulated" to --are regulated--. |
| 12 | 24 | After "and" delete "the". |
| 12 | 25 | Replace "curtailment of the time necessary for development" with --a shorter development time--. |

Signed and Sealed this

Thirtieth Day of November, 1999

Attest:

Q. TODD DICKINSON

Attesting Officer

Acting Commissioner of Patents and Trademarks